United States Patent
Samaddar

(10) Patent No.: US 6,937,085 B1
(45) Date of Patent: Aug. 30, 2005

(54) SENSE AMPLIFIER BASED VOLTAGE COMPARATOR

(75) Inventor: Tapan Samaddar, Santa Clara, CA (US)

(73) Assignee: T-Ram, Inc., San Jose, CA (US)

( * ) Notice: Subject to any disclaimer, the term of this patent is extended or adjusted under 35 U.S.C. 154(b) by 32 days.

(21) Appl. No.: 10/423,767

(22) Filed: Apr. 25, 2003

(51) Int. Cl.[7] ............... H03K 17/296; H03H 11/26
(52) U.S. Cl. ............... 327/393; 327/266; 307/362
(58) Field of Search ............... 323/282, 284, 323/285, 274, 277, 287, 288, 320; 363/21.9, 363/23, 25, 16, 26; 327/54, 52, 57, 135, 163; 307/52, 530

(56) References Cited

U.S. PATENT DOCUMENTS 4,585,001 A * 4/1986 Belt ............... 607/9
5,546,026 A * 8/1996 Lin et al. ............... 327/54
5,770,940 A * 6/1998 Goder ............... 323/282
5,955,910 A * 9/1999 Levin et al. ............... 327/393

* cited by examiner

Primary Examiner—Rajnikant B. Patel

(57) ABSTRACT

The voltage comparator of the present invention comprises a sense amplifier connected to a latch. The sense amplifier has a first input terminal for connecting to the input voltage under consideration and a second input terminal for connecting to the reference voltage. The sense amplifier generates two voltages of opposite logic values (i.e., high or low). A latch accepts these two voltages and generates an output voltage that is indicative of whether the voltage under consideration is higher or lower than the reference voltage. In another embodiment, a signal conditioning circuit is used to reduce the transients in the input voltage under consideration and perform level shifting function.

10 Claims, 3 Drawing Sheets

SENSE AMPLIFIER BASED VOLTAGE COMPARATOR

FIELD OF THE INVENTION

The present invention relates to voltage comparators, and specifically to voltage comparators that do not use operation amplifiers.

BACKGROUND

Existing voltage comparators use high gain operation amplifiers as the active element. A reference voltage and a voltage under consideration are coupled to the inputs of an operation amplifier. When the voltage under consideration is higher than the reference voltage, the output is forced by the high gain operation amplifier to one value (either a high or a low). When the voltage under consideration is lower than the reference voltage, the high gain operation amplifier switches the output to the opposite value. As a result, the output value is indicative of whether the voltage under consideration is higher or lower than the reference voltage.

It is known that high gain operation amplifiers occupy large areas of silicon. Also, the power consumption of operation amplifiers is high. Consequently, it is desirable to have another type of voltage comparators that is smaller, more energy efficient, and runs faster.

SUMMARY

In one embodiment, the voltage comparator of the present invention comprises a sense amplifier coupled to a latch. The sense amplifier has a first input terminal for connecting to the input voltage under consideration and a second input terminal for connecting to the reference voltage. The sense amplifier generates two voltages of opposite logic values (i.e., high or low). A latch accepts these two voltages and generates an output voltage that is indicative of whether the voltage under consideration is higher or lower than the reference voltage.

In another embodiment, a signal conditioning circuit is used to reduce transients in the input voltage under consideration and perform level shifting function.

The above summary is not intended to describe each illustrated embodiment or every implementation of the present invention. The figures and detailed description that follow more particularly exemplify these embodiments.

BRIEF DESCRIPTION OF THE DRAWINGS

Various embodiments of the present invention and methods of operation may be further understood by reference to the following detailed description when read together with the accompanying drawings, in which.

DETAILED DESCRIPTION

In the following description, numerous specific details are set forth to provide an understanding of exemplary embodiments of the present invention. It will be understood, however, that these embodiments may comprise alternative combinations of the disclosed examples. Additionally, readily established circuits and procedures of the exemplary embodiments may be disclosed in simplified form (e.g., simplified block diagrams, flow charts and/or description) to avoid obscuring an understanding the embodiment with excess details.

Figure 1:
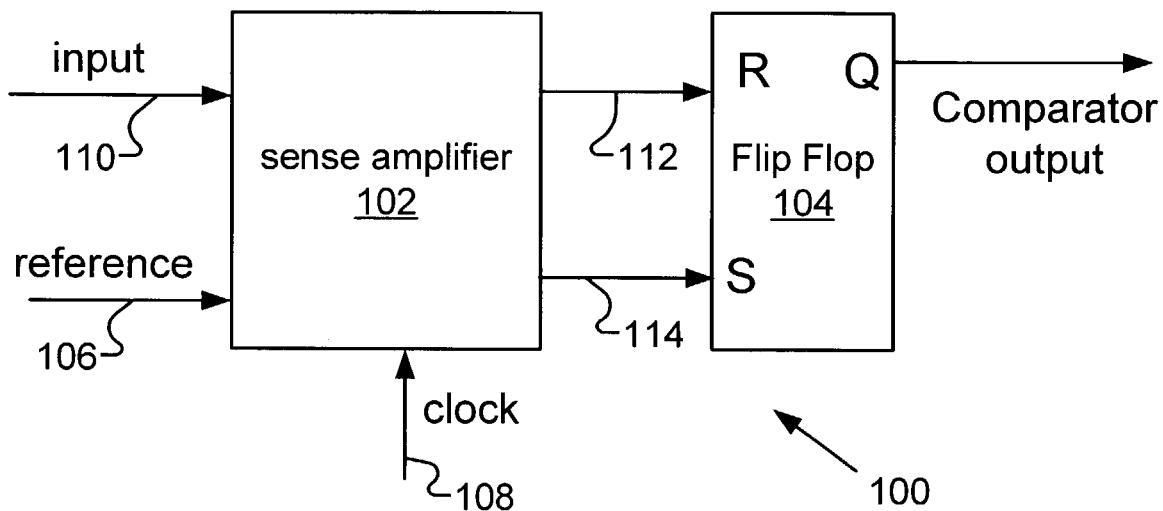
FIG. 1 is a block diagram of a voltage comparator of the present invention.

FIG. 1 is a block diagram of a voltage comparator 100 of the present invention. It comprises a differential sense amplifier 102 and a flip flop 104. This flip flop functions as a latch. Sense amplifier 102 accepts three inputs: a reference voltage 106, a clock signal 108 and an input voltage under consideration 110. Sense amplifier 102 generates two outputs 112 and 114 that are complementary. One of the outputs, such as output 112, is connected to one input terminal of flip flop 104, such as the "R" terminal. The other output is connected to another input terminal (such as the "S" terminal) of flip flop 104. One of the output terminals of flip flop 104, such as the "Q" output, is the output of voltage comparator 100. The value of this output (high or low) is indicative of whether input voltage 110 is higher or lower than reference voltage 106.

Normally a differential sense amplifier is used in memory circuits to amplify the difference in the weak voltages of the bit lines. The differential signal to be amplified is fed into the sense amplifier that has its differential sensing nodes previously precharge to a particular voltage. The sense amplifier is then immediately turning on. Active positive feedback sets in and immediately amplifies and latches the sense amplifiers in the correct direction (i.e., evaluation). This basic characteristic has been used to sense whether a particular voltage is higher or lower than a reference voltage. In one embodiment of the present invention, the reference voltage is set to ground, eliminating the need for a reference voltage circuit.

Figure 2:
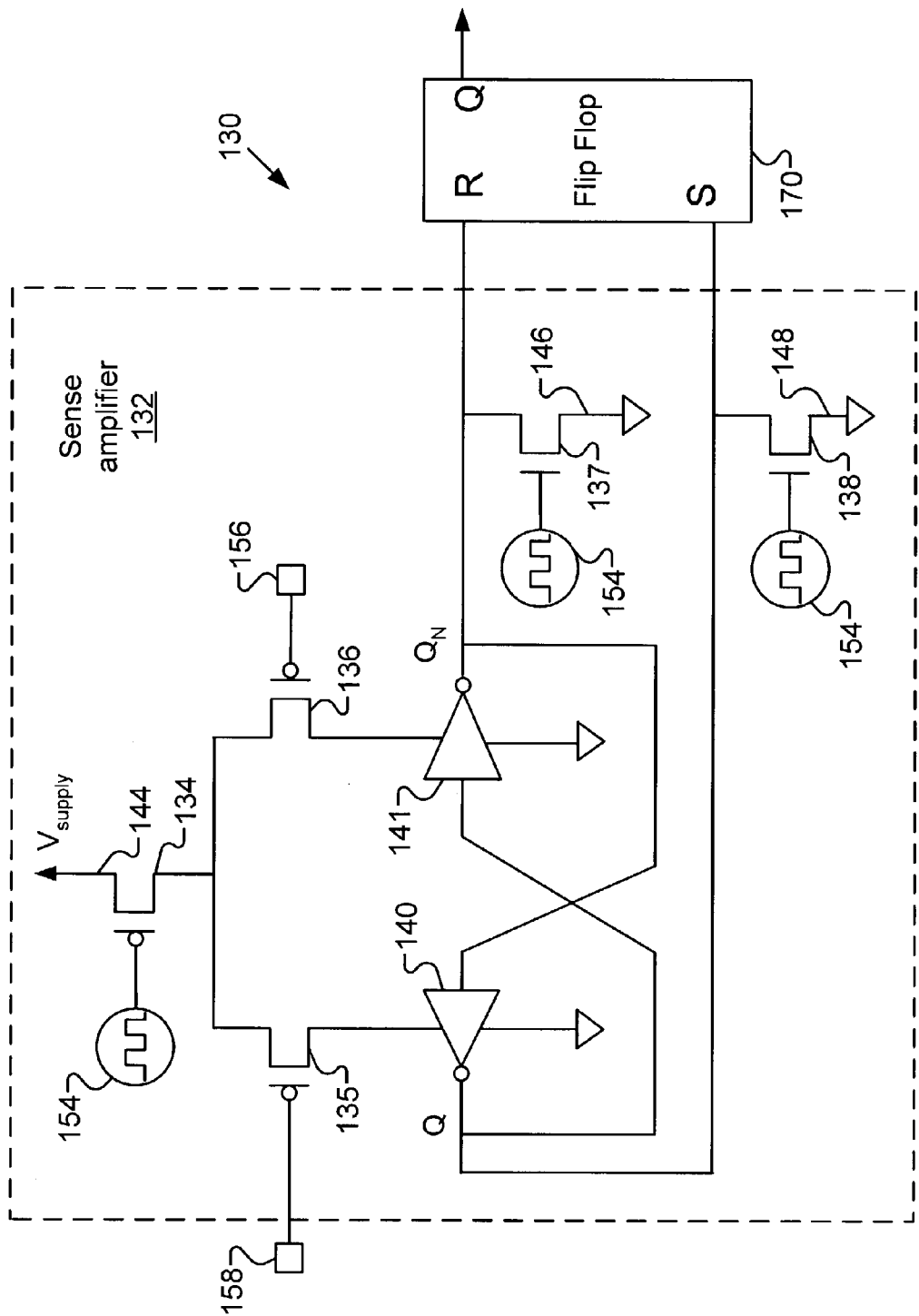
FIG. 2 is a schematic diagram of a voltage comparator of the present invention.

One implementation of a voltage comparator 130 that corresponds to the voltage comparator of FIG. 1 is shown in FIG. 2. It shows a flip flop 170 and an exemplary circuit of a sense amplifier 132. Sense amplifier 132 contains transistors 134–138 and inverters 140 and 141. The terminal 144 of transistor 134 is connected to a supply voltage of comparator 130. Terminals 146 and 148 of transistors 137 and 138, respectively, are connected to ground. The gate terminals of transistors 134, 137 and 138, respectively, are connected to a clock 154. The gate terminal of transistor 136 is connected to a reference voltage source 156 which is in this case at GND level. The gate terminal of transistor 135 is connected to a node 158 for connecting to the voltage under consideration.

The voltage comparator of the present invention operates in two clock phases: precharge and evaluate. During the precharge chase, clock 154 is at a high level. Transistor 134 is turned off, thus cutting off power to sense amplifier 132. Also, transistors 137 and 138 precharge the internal nodes, Q and $Q_N$, to ground. During evaluate phase, clock 154 is at a low level. Transistor 134 turns on the power to sense amplifier 132. Precharging transistors 137 and 138 are turned off. As a result, sense amplifier 132 enters a high gain stage. The internal node voltages at Q and $Q_N$ now take on values that depend on the voltage present at node 158. If this voltage is higher than the reference voltage, sense amplifier 132 will register a logic 0 level at node Q and a logic 1 level at node $Q_N$. If this voltage is lower than ground level, nodes Q and $Q_N$ will have values opposite to the other situation.

Figure 3:
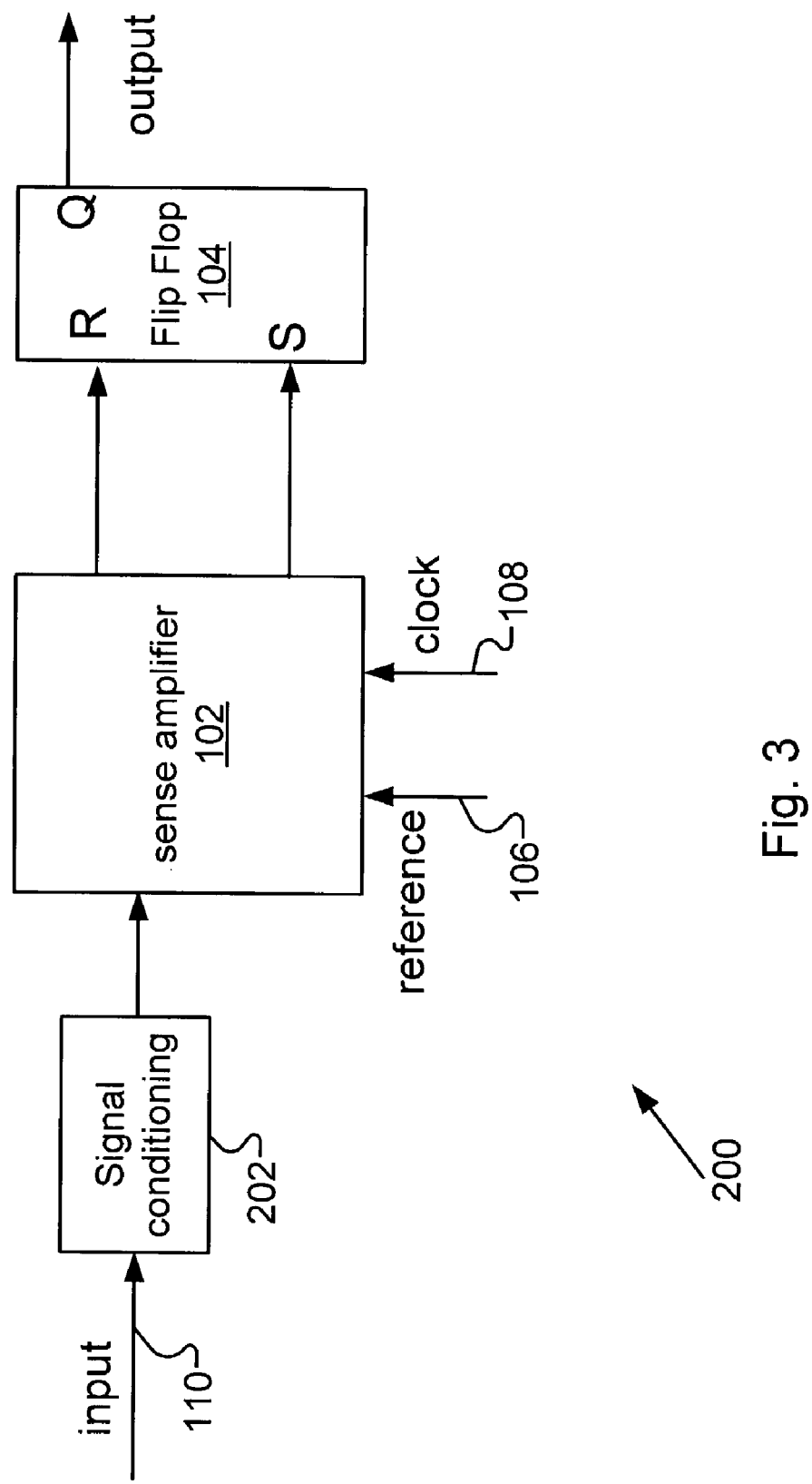
FIG. 3 is a block diagram of another embodiment of a voltage comparator of the present invention.

In some cases, the voltage under consideration has too much transients. It is desirable to use a signal conditioning circuit to clean up the signal. FIG. 3 shows such a voltage comparator 200. Common components in FIGS. 1 and 3 use the same reference numerals. Comparator 200 contains a signal conditioning circuit 202. It accepts noisy input voltage under consideration and generates a clean voltage for delivery to sense amplifier 102. In some situation, signal conditioning circuit 202 also performs voltage level shifting operation.

Figure 4:
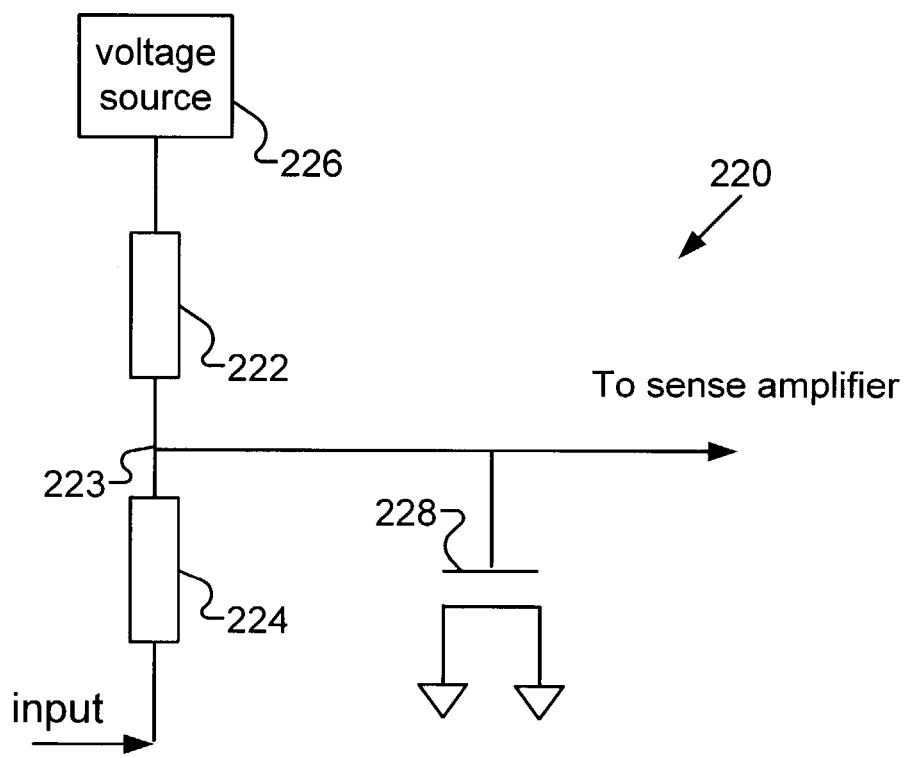
FIG. 4 is a schematic diagram of a signal conditioning circuit that can be used in the voltage comparator of the present invention.

An exemplary signal conditioning circuit 220 is showing in FIG. 4. It comprises two resistors 222 and 224 arranged as a voltage divider. One end of resistor 222 is connected to a voltage source 226. The other end of resistor 224 is connected to the input voltage under consideration. The junction 223 between resistors 222 and 224 is connected to a decoupling capacitor 228 made out of a PMOS transistor. Junction 223 is connected to input 158 of sense amplifier 132 of FIG. 2. Resistors 222 and 224 serve as level shifter and capacitor 228 serves as a filter.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such modifications and changes do not depart from the true spirit and scope of the present invention that is set forth in the following claims.

I claim:

1. A voltage comparator for comparing an input voltage and a reference voltage and generating an output voltage indicative of the comparing, comprising:

a sense amplifier having a first input terminal for connecting to the input voltage and a second input terminal for connecting to the reference voltage, the sense amplifier generating a first output voltage at a first output terminal and a second output voltage at a second output terminal; and a latch coupled to the first and the second output terminals and generating the output voltage;

wherein the reference voltage is at ground level.

2. The voltage comparator of claim 1 wherein the sense amplifier is controlled by a clock signal and operates under a precharge phase and an evaluate phase.

3. The voltage comparator of claim 1 wherein the latch is a flip flop.

4. The voltage comparator of claim 1 further comprising a signal conditioning circuit that can remove transients of the input voltage.

5. The voltage comparator of claim 4 wherein the signal conditioning circuit comprises two resistors connected to a decoupling capacitor.

6. The voltage comparator of claim 5 wherein the capacitor comprises a transistor.

7. A method for comparing an input voltage and a reference voltage, comprising:

providing a sense amplifier having a first input terminal for connecting to the input voltage and a second input terminal for connecting to the reference voltage, the sense amplifier generating a first output voltage at a first output terminal and a second output voltage at a second output terminal;

connecting the first output terminal to one input terminal of a latch and connecting the second output terminal to another input terminal of the latch; and generating by the latch an output voltage indicative of a comparison of the input voltage and the reference voltage;

wherein the reference voltage is at ground level.

8. The method of claim 7 further comprising controlling the sense amplifier using a clock signal, and wherein the sense amplifier operates under a precharge phase and an evaluate phase.

9. The method of claim 7 further comprising removing transients of the input voltage.

10. The method of claim 7 wherein the latch is a flip flop.

* * * * *